(12) United States Patent
Nakagomi et al.

(10) Patent No.: US 6,239,602 B1
(45) Date of Patent: May 29, 2001

(54) TEMPERATURE MANAGING APPARATUS FOR MULTI-STAGE CONTAINER

(75) Inventors: Yoichi Nakagomi, Minamikoma-gun; Kunihiro Furuya, Nirasaki; Hiroshi Tsukada, Kitakoma-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/324,427

(22) Filed: Jun. 1, 1999

(30) Foreign Application Priority Data

Jun. 2, 1998 (JP) .................................................. 10-169206

(51) Int. Cl.⁷ .............................. G01R 31/02; F28F 7/00
(52) U.S. Cl. ........................................... 324/760; 165/80.4
(58) Field of Search ............................ 324/760; 165/205, 165/236, 48.1, 61, 80.4, 80.5; 361/689, 698, 701

(56) References Cited

U.S. PATENT DOCUMENTS 3,949,295 * 4/1976 Moorshead ........................... 324/760
5,198,752 * 3/1993 Miyata et al. ....................... 324/760
5,977,785 * 11/1999 Burward-Hoy ...................... 324/760
6,114,868 * 9/2000 Nevill ................................. 324/760

FOREIGN PATENT DOCUMENTS

| 2-197142 | 8/1990 | (JP) . |
| 7-231019 | 8/1995 | (JP) . |
| 8-5666 | 1/1996 | (JP) . |
| 8-340030 | 12/1996 | (JP) . |
| 11-145225 | 5/1999 | (JP) . |

* cited by examiner

*Primary Examiner*—Safet Metjahic
*Assistant Examiner*—Anjan Deb
(74) *Attorney, Agent, or Firm*—Morrison & Foerster

(57) ABSTRACT

A temperature managing apparatus according to the invention comprises cooling jackets provided in each of a plurality of test containers, a tank for storing a cooling medium for the cooling jackets, first pumps, second pump, constant pressure valves for making constant the amount of the transferred cooling medium, and a heat exchanger. The tank has partitions that are horizontally and vertically movable. The partitions partition the interior of the tank into a first storage area, a second storage area, and a third area interposed therebetween.

14 Claims, 5 Drawing Sheets

TEMPERATURE MANAGING APPARATUS FOR MULTI-STAGE CONTAINER

BACKGROUND OF THE INVENTION

This invention relates to a temperature managing apparatus and method for simultaneously managing the temperatures of objects to be temperature controlled contained in a plurality of containers.

Further, the invention relates to a temperature managing apparatus and method for simultaneously managing the temperatures of objects to be temperature controlled serving as heat generators for generating heat.

Furthermore, the invention relates to a temperature managing apparatus wherein the objects to be temperature controlled each consist of an integral object (hereinafter referred to as a "shell") obtained by integrally forming a contactor, a semiconductor wafer (hereinafter referred to as a "wafer") and a wafer chuck by a vacuum force, and wherein the containers are each used as a test room for performing tests such as a reliability test, an electric characteristic test, etc. of a plurality of semiconductor elements (hereinafter referred to as "IC chips") formed on the wafer.

In the above-mentioned reliability test, thermo-stress and electrical stress are applied to packaged IC chips, thereby to detect latent defects therein and then to eliminate defective IC chips. IC chips have been and are now more and more miniaturized and highly integrated in accordance with miniaturization and/or functionalization of electric products. Moreover, to further decrease the size of semiconductor products, various IC-chip mounting techniques are now being developed. In particular, a technique for mounting so-called bear chips that are not packaged have been and are being developed. Before putting bear chips on the market, they must be subjected to a reliability test. In the conventional reliability test, however, various problems, which include a problem of electrical connection between a bear chip and a socket, have to be solved before the test. Further, the conventional reliability test may require lots of time and effort and hence a high cost since small bear chips are handled therein.

In light of this, a technique for testing the reliability of IC chips, which are in a wafer state, is now proposed in, for example, Japanese Patent Application KOKAI Publications Nos. 7-231019, 8-5666 and 8-340030. In particular, the first and second publications propose a technique for simultaneously bringing, when testing the reliability of a wafer, the contacts of the wafer into contact with those of a contactor (e.g. a probe sheet) in a reliable manner even under the influence of heat. In order to secure the accuracy of the test for testing the reliability of IC chips provided on a wafer, it is very important to put, as mentioned above, the contacts of the wafer into simultaneous and accurate contact with those of a contactor at a high temperature. Moreover, a technique for efficiently heating a wafer to a predetermined test temperature in, for example, a constant-temperature bath used for the reliability test, and accurately maintaining the wafer at the test temperature is also very important.

Although various techniques are necessary for the reliability test for testing IC chips in a wafer state, in which the contacts of the wafer are simultaneously put into contact with those of a contactor, have been proposed so far, there is no satisfactory technique for maintaining the wafer at a predetermined test temperature in a container such as a constant-temperature bath. Under these circumstances, the applicant of this invention proposed, in the specification of Japanese Patent Application No. 9-318920, a technique for maintaining a wafer at a constant test temperature when performing a reliability test. More specifically, the proposed invention relates to a technique for maintaining the temperature of a wafer contained in a wafer container at a constant value. In this proposed invention, however, to simultaneously control the temperatures of a plurality of to-be-tested objects each contained in a corresponding one of containers is left as a technique to be developed.

BRIEF SUMMARY OF THE INVENTION

The invention has been developed to solve the problem.

It is an object of the invention to simultaneously manage the temperatures of objects to be temperature controlled, as to-be-tested objects, contained in a plurality of containers.

It is another object of the invention to simultaneously manage the temperatures of heat generators, as objects to be temperature controlled, contained in a plurality of containers.

It is yet another object of the invention to simultaneously manage the temperatures of a plurality of integral objects as aforementioned each contained in a corresponding one of test chambers, which are used for executing a reliability test and an electric characteristic test of a plurality of IC chips formed on a semiconductor wafer included in each integral object.

According to a first aspect of the invention, there is provided a temperature managing apparatus for simultaneously maintaining, at a predetermined temperature, objects to be temperature controlled contained in containers, comprising:

a plurality of containers each containing an object to be temperature controlled;

a plurality of jackets provided in each of the containers for controlling the temperature of a corresponding one of the objects to be temperature controlled;

a tank for storing a temperature control medium for the jackets, the tank including first and second storage areas partitioned by at least one movable partition;

a pipe line and a pump for transferring the temperature control medium from the first storage area to each jacket;

a pipe line for transferring the temperature control medium from the each jacket to the second storage area;

a pipe line and a pump for transferring the temperature control medium from the second storage area to the first storage area via a heat exchanger for adjusting the temperature control medium to a predetermined temperature;

a thermometer for measuring a temperature of the temperature control medium in the second storage area; and a partition driving mechanism for moving the at least one partition on the basis of the temperature measured by the temperature measuring device.

According to a second aspect of the invention, there is provided a temperature managing apparatus for simultaneously maintaining, at a predetermined temperature, heat generators contained in containers, comprising:

a plurality of containers each containing a heat generator;

a plurality of cooling jackets provided in each of the containers for controlling the temperature of a corresponding one of the heat generators;

a tank for storing a temperature control medium for the cooling jackets, the tank including first and second storage areas partitioned by at least one movable partition;

a pipe line and a pump for transferring the temperature control medium from the first storage area to each cooling jacket;

a pipe line for transferring the temperature control medium from the each cooling jacket to the second storage area;

a pipe line and a pump for transferring the temperature control medium from the second storage area to the first storage area via a heat exchanger for adjusting the temperature control medium to a predeter-mined temperature;

a thermometer for measuring a temperature of the temperature control medium in the second storage area; and a partition driving mechanism for moving the at least one partition on the basis of the temperature measured by the temperature measuring device.

In the temperature managing apparatus according to the first or second aspect, it is preferable that the at least one partition includes two partitions, and the tank is partitioned by the two partitions into the first and second storage areas and a third storage area defined between the first and second storage areas.

In the temperature managing apparatus, it is more preferable that the plurality of jackets include an upper jacket located above each object to be temperature controlled, and a lower jacket located below the each object to be temperature controlled.

It is further preferable that the temperature managing apparatus further comprises a constant pressure control valve provided across the pipe line that transfers the temperature control medium from the first storage area to each jacket, the constant pressure control valve making constant an amount of the temperature control medium transferred to the each jacket, thereby stabilizing temperature control performed by the each jacket.

It is also preferable that the temperature managing apparatus further comprises a constant pressure relief valve provided across the pipe line that transfers the temperature control medium from the first storage area to each jacket, the constant pressure relief valve making constant an amount of the temperature control medium transferred to the each jacket, thereby stabilizing temperature control performed by the each jacket.

It is preferable that the temperature managing apparatus further comprises:

a temperature control mechanism for making constant a temperature of the temperature control medium transferred from the first storage area to each jacket, using movement of the partition that partitions the tank into the first and second storage areas, and the heat exchanger; and a constant pressure control valve and a constant pressure relief valve that are provided across the pipe line that transfers the temperature control medium from the first storage area to the each jacket, wherein the temperature control medium is transferred at a constant temperature and a constant flow rate from the first storage area to the each jacket, such that temperature control by the each jacket is stabilized.

In the temperature managing apparatus according to the second aspect, it is preferable that the plurality of cooling jackets include an upper cooling jacket located above each heat generator, and a lower cooling jacket located below the each heat generator, and that the apparatus further comprises heater means to be subjected to PID (proportional, integral, differential) control.

In the temperature managing apparatus according to the second aspect, it is preferable that the heat generators each consist of an integral object obtained by integrally forming a contactor, a semiconductor wafer and a wafer chuck as one body by a vacuum force; and that the containers each consist of a test chamber for executing one of a reliability test and an electric characteristic test of a plurality of semiconductor elements formed on the semiconductor wafer included in the integral object.

In the temperature managing apparatus according to the first or second aspect, a temperature managing method is used for simultaneously maintaining, at a predetermined temperature, a plurality of objects to be temperature controlled each contained in a corresponding one of containers, comprising the steps of:

moving the partition that partitions the tank into the first and second storage areas, and using the heat exchanger, such that a temperature of the temperature control medium transferred from the first storage area to each jacket is made constant; and transferring the temperature control medium at a constant flow rate, using the constant pressure control valve and the constant pressure relief valve provided across the pipe line that transfers the temperature control medium from the first storage area to the each jacket.

BRIEF DESCRIPTION OF THE SEVERAL VIEWS OF THE DRAWING

The accompanying drawings, which are incorporated in and constitute a part of the specification, illustrate presently preferred embodiment of the present invention and, together with the general description given above and the detailed description of the preferred embodiment given below, serve to explain the principles of the present invention in which.

DETAILED DESCRIPTION OF THE INVENTION

The invention relates to a temperature managing apparatus and method for simultaneously managing the temperatures of objects to be temperature controlled contained in a plurality of containers. Further, the invention relates to a temperature managing apparatus and method for simultaneously managing the temperatures of objects to be temperature controlled, as heat generators. In addition, the invention relates to a temperature managing apparatus and method for simultaneously managing the temperatures of a plurality of integral objects as aforementioned each contained in a corresponding one of test chambers, which are used for executing one of a reliability test and an electric characteristic test of a plurality of IC chips formed on a wafer included in each integral object.

Accordingly, the invention is not limited to a temperature managing apparatus and method employed in a reliability test apparatus for testing the reliability of a semiconductor wafer. However, in order to more specifically describe the invention, an embodiment will be described in which the invention is applied to an apparatus for simultaneously testing the reliability of a plurality of IC chips.

Referring first to FIGS. 1 to 6, the embodiment of the invention will be described.

Figure 2:
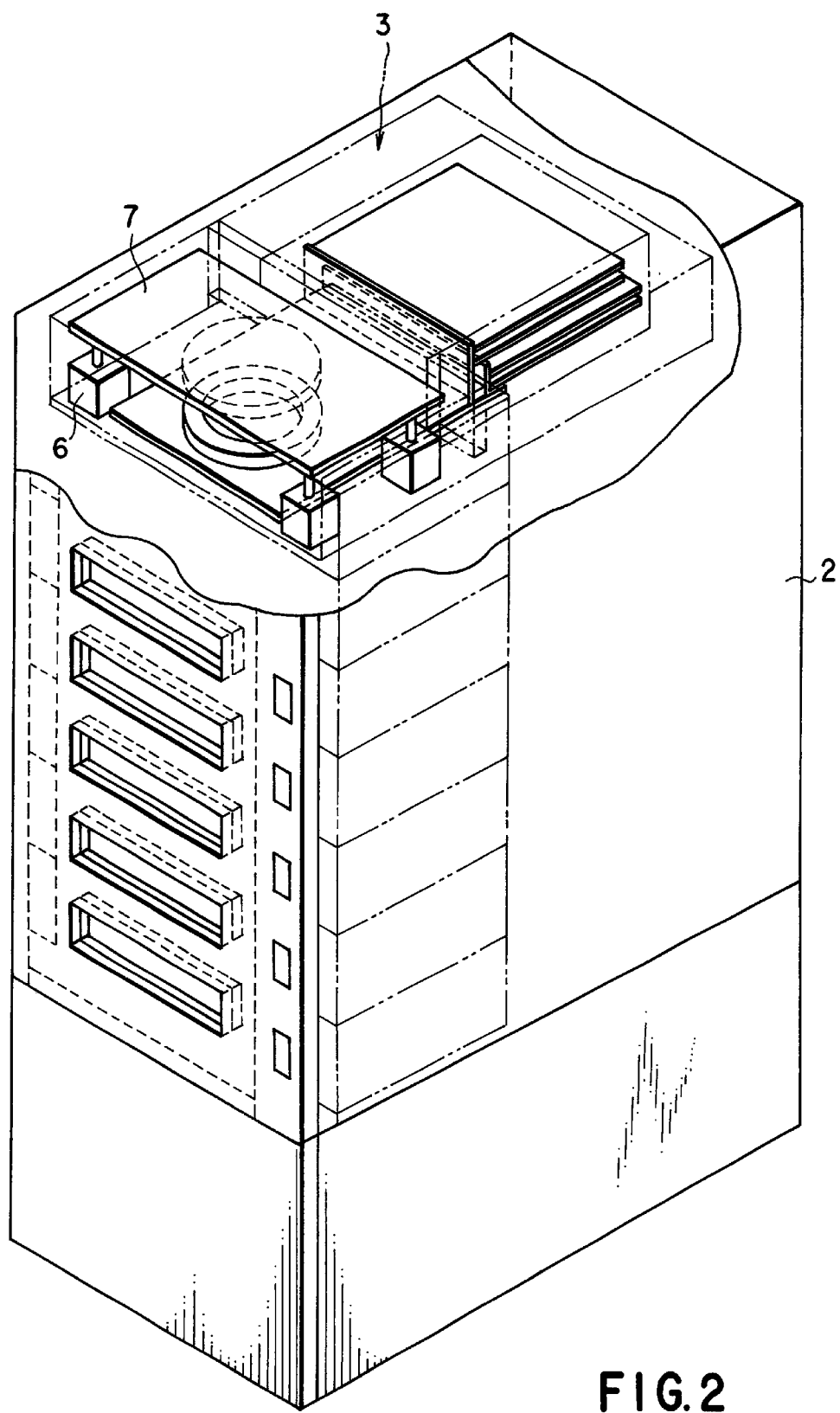
FIG. 2 is a perspective view partly in section, illustrating an example of a reliability test apparatus to which the temperature managing apparatus of FIG. 1 is applied.
Figure 3:
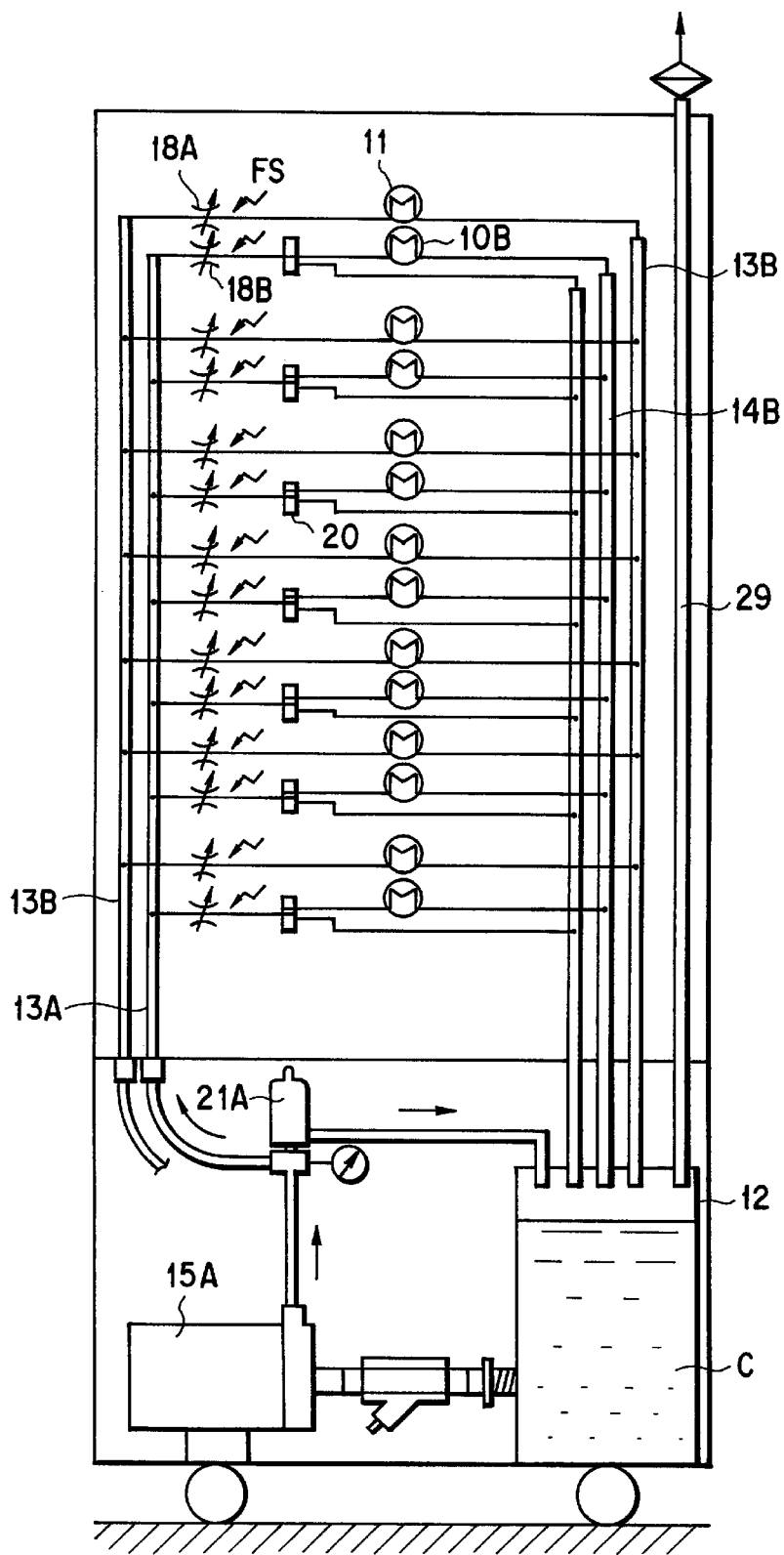
FIG. 3 is a sectional view showing, in more detail, the cooling water circuit of the reliability test apparatus of FIG. 2.

A temperature managing apparatus 1 according to the embodiment, as shown in FIG. 3, can be installed in a wafer reliability test apparatus 2 as shown in FIG. 2. As is shown in FIG. 2, a plurality of containers 3 are mounted dismountable in the reliability test apparatus 2 such that they are arranged in plural stages.

Each container 3 contains an object to be temperature controlled, and is adjusted to a predetermined temperature. This predetermined temperature includes a certain constant temperature, a temperature that changes in jumps, and a temperature that changes gradually, etc.

In this embodiment, each container 3 is a reliability testing chamber (hereinafter referred to as a "test container"), and an object to be temperature controlled contained therein is an object to be tested. Where the to-be-tested object is the aforementioned shell, the shell is a heat generator that is heated by heat generated from IC chips included therein. Each heat generator is adjusted to a constant temperature by the temperature managing apparatus within a corresponding test container.

Figure 4:
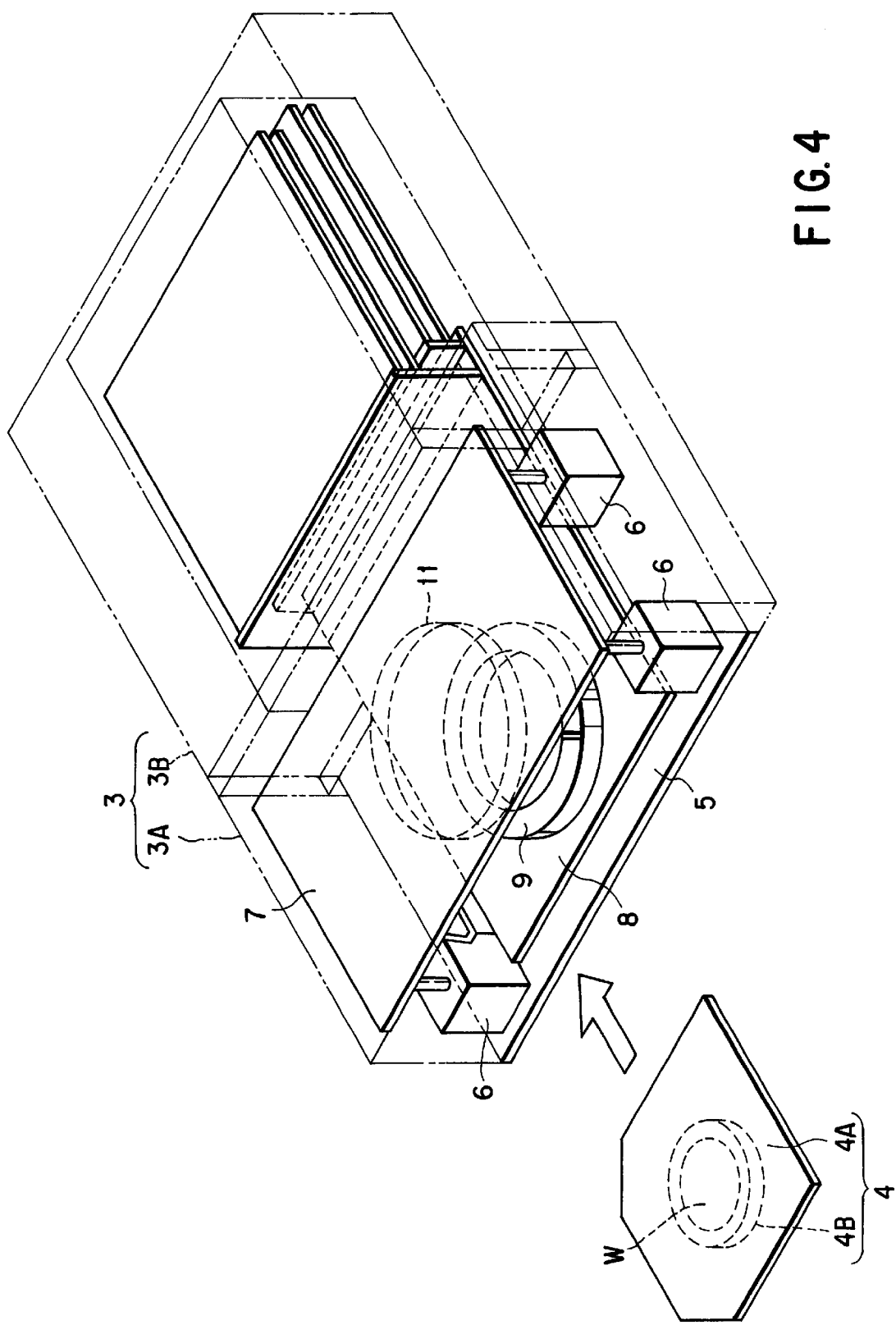
FIG. 4 is a perspective view showing a state in which a shell is mounted into a test container incorporated in the reliability test apparatus of FIG. 2.

Before describing the temperature managing apparatus 1, each test container 3 and each shell 4 will be described with reference to FIGS. 4 to 6. As is shown in FIG. 4, each test container 3 has a temperature control chamber 3A and a connector chamber 3B. These chambers 3A and 3B are partitioned by an adiabatic wall (not shown) to thereby prevent the temperature in the connector chamber 3B from increasing. As will be described later, a wafer W as a to-be-tested object is adjusted to a predetermined test temperature within the temperature control chamber 3A.

As is shown in FIG. 4, cylinder mechanisms 6 are provided at the respective four corners of a base table 5 located in the temperature control chamber 3A. The upper end of the cylinder rod of each cylinder mechanism 6 is coupled to a corresponding one of the four corners of a pushing plate 7. A clamp mechanism (not shown) is provided on the reverse surface of the pushing plate 7. This clamp mechanism enables attachment and detachment of the shell 4 to and from the test container 3. The connector chamber 3B contains a connector for connecting the chamber 3B to a tester, and a wiring board, which are not shown.

As is shown in FIG. 4, the shell 4 comprises a wafer W with IC chips formed thereon, a contactor 4A having contacts to be simultaneously brought into contact with the test electrodes of the IC chips, and a wafer holding member (hereinafter referred to as a "wafer chuck") 4B. These three elements are kept in an integral state by a vacuum force. When performing a reliability test on IC chips, the three elements that are kept integral as the shell 4 are detachably inserted into each test container 3. In the integral state, multiple test electrodes of the IC chips are in contact with the respective contacts (e.g. bump terminals) of the contactor.

Figure 5:
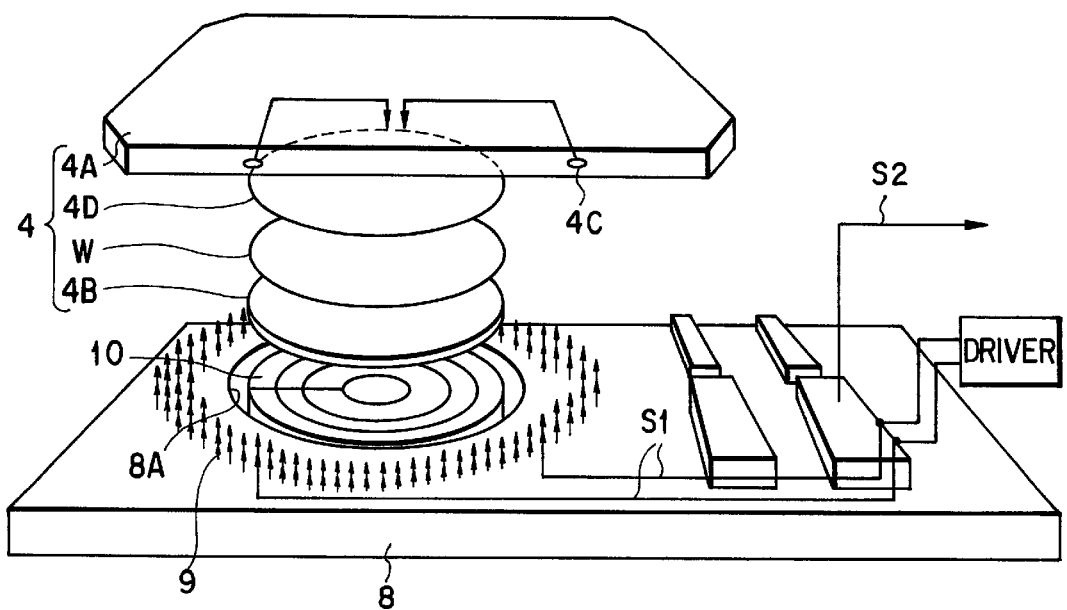
FIG. 5 is an exploded perspective view illustrating the relationship between the shell and the test container shown in FIG. 4.

As is shown in FIG. 5, a base plate 8 is interposed between the base table 5 and the pushing plate 7 such that it extends parallel to the base table 5. A circular hole 8A is formed in a substantially central portion of the base plate 8. As is shown in FIGS. 4 and 5, multiple (e.g. 2000–3000) POGO pins 9 are half embedded in the base plate 8 such that they form a plurality of concentric circles. The contactor 4A has multiple external terminals 4C connected to the bump terminals. The external terminals 4C electrically contact the respective POGO pins 9. In FIG. 5, reference numeral 4D denotes an anisotropic electric conductive sheet that electrically relays between the contactor 4A and the IC chips.

Further, as is shown in FIG. 5, a bottom jacket 10 with a diameter slightly smaller than the hole 8A is provided on the base table 5 inside the hole 8A. The upper surface of the bottom jacket 10 is substantially level with the upper surface of the base plate 8. The bottom jacket 10 contains a wafer temperature control device 10A as shown in FIG. 6. The wafer temperature control device 10A heats the shell 4 to a predetermined test temperature (e.g. 150° C.) and keeps it at the test temperature.

Figure 6:
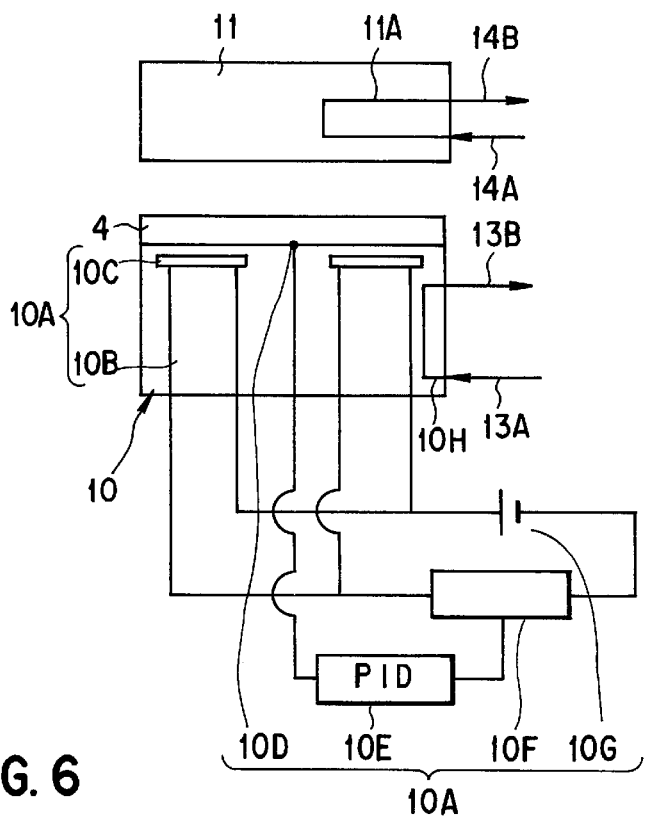
FIG. 6 is a sectional view showing the structure of a bottom jacket that appears in FIG. 5.

Further, as is shown in FIG. 6, the wafer temperature control device 10A can include a cooling jacket 10B, a surface heater 10C, a temperature sensor 10D, a PID controller 10E, a relay 10F and a heater power supply 10G. The cooling jacket 10B can be located below the surface heater 10C. The surface heater 10C can be located on the surface side of the bottom jacket 10. The cooling jacket and the surface heater can be thermally isolated from each other using a heat resistance sheet (not shown). This heat resistance sheet interrupts the flow of heat from the surface heater 10C to the cooling jacket 10B. A temperature control medium C (e.g. a coolant consisting of cooling water of about 70° C.) is made to flow through the cooling jacket 10B. The thermometer 10D measures the heating temperature of the surface heater 10C. On the basis of the measured temperature, the PID controller 10E controls the temperature of the surface heater 10C, thereby managing the temperature of the test container 3 and shell 4. An upper cooling jacket 11 is provided above the bottom jacket 10 and fixed to the pushing plate 7. Both the jackets 10B and 11 cool the shell 4 to the test temperature.

The cooling jackets 10B and 11 have coolant passages 10H and 11A respectively formed therein for passing cooling water C therethrough. The cooling jacket 10B will be referred to as a "lower cooling jacket".

Figure 1:
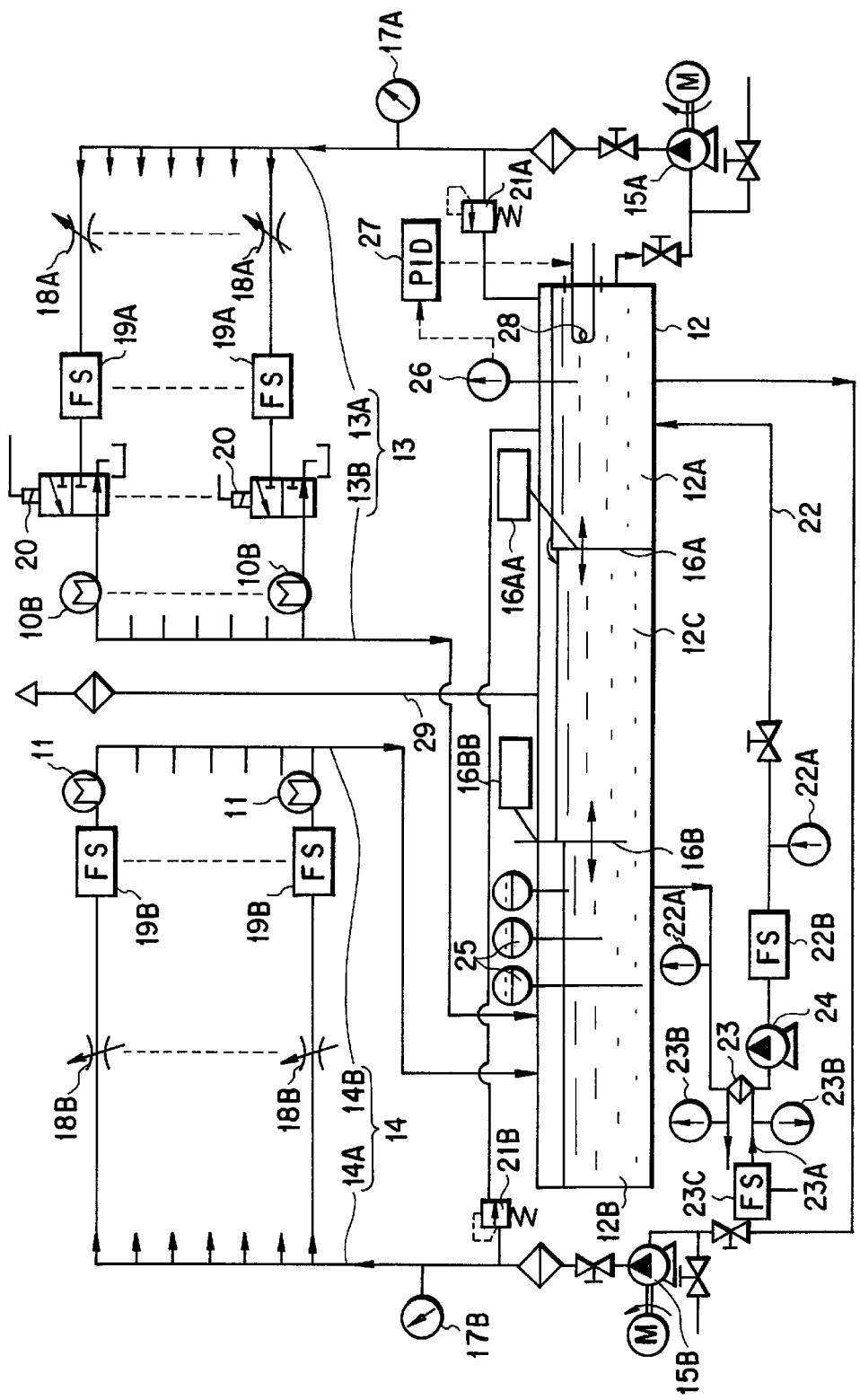
FIG. 1 is a view illustrating a cooling water circuit incorporated in a temperature managing apparatus according to the embodiment of the invention.

Referring back to FIGS. 1 to 3, the temperature managing apparatus 1 will be described. As is shown in FIGS. 1 and 3, the temperature managing apparatus 1 comprises the lower and upper jackets 10B and 11 contained in each test container 3, a tank 12 as a reservoir of the cooling water C to be passed through the jackets 10B and 11, first and second cooling water lines 13 and 14 for permitting the cooling water C to flow to the cooling jackets 10B and 11, respectively, and first and second pumps 15A and 15B for causing the cooling water C to flow.

The tank 12 has first and second partitions 16A and 16B that can be moved vertically and horizontally by partition driving mechanisms 16AA and 16BB, respectively. The first and second partitions 16A and 16B can partition the interior of the tank 12 into first, second and third storage areas 12A, 12B and 12C. The first storage area 12A stores a cooling medium C (e.g. cooling water of 50° C.) to be supplied into the cooling jackets 10B and 11, while the second storage area 12B stores a cooling medium C (e.g. cooling water of 70° C.) returned from the cooling jackets 10B and 11.

The third storage area 12C stores cooling water C flowing therein from the first and second storage areas 12A and 12B, and serves as a buffer area that interrupts the flow of the cooling water between the first and second storage areas 12A and 12B. The third storage area 12C facilitates the adjustment of the cooling water C in the first storage area 12A at a constant temperature (e.g. 50° C.).

A first outlet pipe line 13A has an end connected to the first storage area 12A side of the tank 12, and the other end divided into two branch lines. One of the two branch lines is connected to the inlet of the internal passage 10H (see FIG. 6) of the lower cooling jacket 10B of a corresponding one of the test containers 3 stacked in seven stages. A first return pipe line 13B has an end connected to the outlet of the internal passage 10H of each lower cooling jacket 10B, and the other end connected to the second storage area 12B side of the tank 12. A pressure gauge 17A is provided across that portion of the first outlet pipe line 13A which is located between the first cooling wafer pump 15A and the branch lines of the line 13A. The pressure gauge 17A measures the pressure of the cooling water C supplied from the first storage area 12A to the lower cooling jacket 10B.

A constant pressure control valve 18A, a flow meter 19A and a switch valve 20 (e.g. a three-port electromagnetic valve) are provided across each of the branch lines of the first outlet pipe line 13A, which are connected to the respective cooling jackets. A constant amount of cooling water C is supplied to each cooling jacket 10B through a corresponding one of the constant pressure control valves 18A. The flow meter 19A measures the flow rate of the cooling water C supplied to each cooling jacket 10B.

An excessive amount of cooling water C in each cooling jacket 10B is returned to the first storage area 12A through a corresponding one of the switch valves 20. The first outlet pipe line 13A also branches between the first cooling water pump 15A and the pressure gauge 17A. A constant pressure relief valve 21A is provided across that portion of the first outlet pipe line 13A which is connected to the upper surface of the first storage area 12A. When the pressure of the cooling water C in the first outlet pipe line 13A exceeds a predetermined value (e.g. 0.5 Kgf/cm$^2$), the constant pressure relief valve 21A operates, thereby returning the cooling water C to the first storage area 12A of the tank 12.

Like the first cooling water line 13, the second cooling water line 14 has a second outlet pipe line 14A and a second return pipe line 14B. A pressure gauge 17B and a constant pressure relief valve 21B are provided across the second outlet pipe line 14A. Further, a constant pressure control valve 18B and a flow meter 19B are provided across each branch line that is connected between the second outlet pipe line 14A and a corresponding cooling jacket.

Each of the above-mentioned elements functions in a similar manner to a corresponding element provided across the first cooling water line 13. The first and second storage areas 12A and 12B are connected to each other through a communication pipe 22. A heat exchanger 23 and a transfer pump 24 are provided across the communication pipe 22. The transfer pump 24 permits the cooling water C within the second storage area 12B to transfer to the first storage area 12A. During the transfer, the cooling water C is cooled, for example, from 70° C. to 50° C. by the heat exchanger 23. Thermometers 22A and 22A are provided across the communication pipe 22 before and after the heat exchanger 23. The thermometers 22A and 22A manage the temperature of the cooling water C before and after the heat exchanger 23. Reference numeral 22B designates a flow meter. Primary cooling water (for example, water of 30° C. supplied from a cooling tower) is supplied to the heat exchanger 23 through a pipe 23A. The primary cooling water cools the cooling water C, for example, from 70° C. to 50° C.

Thermometers 23B and 23B are provided at the inlet and the outlet of the heat exchanger 23 for measuring the temperature of the primary cooling water before and after the heat exchanger 23, respectively. The flow of the primary cooling water is adjusted by a proportional valve (not shown) on the basis of the measured temperature. Reference numeral 23C designates a flow meter.

As described above, the temperature control mechanism for adjusting, to a constant value, the temperature of the temperature control medium C carried from the first storage area 12A to each jacket includes the heat exchanger 23 and the partitions.

Three, for example, water level meters 25, which have different measurement levels, can be provided in the second storage area 12B of the tank 12. On the basis of the level of water measured by the water level meters 25, the water level of the second storage area 12B is managed.

The amount of cooling water overflowing from the first storage area 12A into the third storage area 12C is adjusted by vertically moving the first partition 16A. Further, the opening area between the second storage area 12B and the third storage area 12C is adjusted by vertically moving the second partition 16B. The temperature of the cooling water C within the second storage area 12B can be adjusted by moving the first and second partitions 16A and 16B. The capacities of the first, second and third storage areas 12A, 12B and 12C are adjusted by horizontally moving the first and second partitions 16A and 16B, thereby adjusting the temperature of the cooling water C.

A thermometer 26 is provided for the tank 12 for measuring the temperature of the cooling water C within the first storage area 12A. A PID controller 27 is connected to the thermometer 26. A heater 28 is also provided for the tank 12 for heating the cooling water C within the first storage area 12A. When the temperature of the cooling water C has lowered as a result of the outgoing radiation of the water within the first storage area 12A, or because of water returned from the branch lines, the PID controller 27 controls the heater 28 on the basis of the measurement result of the thermometer 26, thereby to adjust the cooling water C to a set temperature (e.g. 50° C.) at all times. A release pipe 29 has one end connected to the upper surface of the tank 12 and the other end to the atmosphere to maintain the pressure inside the tank 12 at an atmospheric pressure. Vapor leaking from the tank 12 to the atmosphere condenses into water within the release pipe 29 and returns into the third storage area 12C.

The operation of the above-described apparatus will now be described.

To test the reliability of IC chips formed on a wafer W, first, each shell 4 is inserted by an automatic transfer machine into a corresponding test container 3 in the reliability test apparatus. After the insertion of the shells 4 into the test containers 3, the temperature managing apparatus 1 is driven. Upon starting the reliability test, the wafer temperature control device 10A in each bottom jacket 10 operates. Each bottom jacket 10 is heated to a test temperature (e.g. 150° C.) by corresponding heater 10C and lower cooling jacket 10B. On the other hand, each shell 4 that generates heat during the test is cooled from its upper surface by a corresponding upper cooling jacket 11 and kept at the test temperature.

While the lower and upper cooling jackets 10B and 11 operate, a predetermined amount of cooling water C of a predetermined temperature (e.g. 50° C.) circulates through them, thereby reliably maintaining the shells 4 at the test temperature. The first cooling water pump 15A pumps up cooling water C of e.g. 50° C. from the first storage area 12A of the tank 12, and supplies it to each lower cooling jacket 10B through the first outlet pipe line 13A. At this time, the constant pressure relief valve 21A keeps, at a constant value (e.g. 0.5 Kgf/cm$^2$), the pressure of the cooling water C that passes through the first outlet pipe line 13A, while the constant pressure control valve 18A keeps the flow of the cooling water C at a constant value. Accordingly, the cooling capacity of each lower cooling jacket 10B is kept constant.

If the cooling capacity of each lower cooling jacket 10B is excessive, a corresponding switch valve 20 is operated to adjust the flow of the cooling water supplied thereto.

The second cooling water pump 15B pumps up cooling water C of e.g. 50° C. from the first storage area 12A of the tank 12, and supplies it to each upper cooling jacket 11 through the second outlet pipe line 14A. The constant pressure relief valve 21B keeps the pressure of the cooling water C at a constant value (e.g. 0.5 Kgf/cm$^2$), while the constant pressure control valve 18B keeps the flow of the cooling water C at a constant value. Thus, the cooling capacity of each upper cooling jacket 11 is kept constant.

The transfer pump 24 transfers cooling water C of e.g. about 70° C. from the second storage area 12B of the tank 12 through the communication pipe 22 to the heat exchanger 23, where the water is cooled to 50° C. The transfer pump 24 also returns the cooling water C of e.g. 50° C. into the first storage area 12A of the tank 12, thereby replenishing the cooling water C by the amount used for cooling the cooling jackets.

The temperature of the primary cooling water supplied into and out of the heat exchanger 23 is measured by the thermometers 23B and 23B, and controlled by the proportional valve. If there is a shortage or excessiveness in cooling capacity of the heat exchanger 23, the cooling capacity is adjusted by changing the flow of the primary cooling water.

Where the temperature of the cooling water C in the first storage area 12A is low as a result of, for example, radiation of heat, it is controlled to a target value (e.g. 50° C.) using the thermometer 26, the PID controller 27 and the heater 28.

Accordingly, while the IC chips formed on the wafer W are tested, the cooling water C in the first storage area 12A is managed to be kept at a constant temperature (e.g. 50° C.). Keeping the cooling water C at the constant temperature stabilizes the cooling capacity of each of the lower and upper cooling jackets 10B and 11, and permits the shells 4 to be maintained at the test temperature (e.g. 150° C.). After the wafer W reaches the test temperature, a test signal S1 is transmitted from a driver to IC chips on the wafer W via the connector, the POGO pins 9, the contactor 4A. A signal S2 indicative of the test result is transmitted to the tester through the opposite route. The tester can test all IC chips formed on the wafer in a reliable manner.

Since as described above, each shell 4 is cooled from above and below by corresponding lower and upper cooling jackets 10B and 11, it can be uniformly cooled, which enables execution of a stable reliability test.

Moreover, the first and second partitions 16A and 16B partition the interior of the tank 12 into the first, second and third storage areas 12A, 12B and 12C. The third storage area 12C defined between the first and second storage areas 12A and 12B serves as a buffer area, which permits the cooling water C in the first storage area 12A to be kept at a constant temperature (e.g. 50° C.) more reliably.

The constant pressure control valves 18A and 18B, which are provided across the branch lines of the first and second outlet pipe lines 13A and 14A, enables supply of a constant amount of cooling water C to the lower and upper cooling jackets 10B and 11 without the influence of pressure fluctuation on the upstream side, thereby stabilizing the cooling capacities of the jackets 10B and 11.

The constant pressure relief valves 21A and 21B, which are provided across the first and second outlet pipe lines 13A and 14A, respectively, keeps the water pressure in the pipe lines constant and hence stabilizes the circulated amount of the cooling water C.

The invention is not limited to the above-described embodiment, but may be modified appropriately when necessary.

For example, although the embodiment employs the first and second partitions 16A and 16B, only one partition may be employed instead of the two.

The partition driving mechanism may be an automatic one or a manual one.

Since the temperature of the cooling water C in the first storage area 12A is maintained at a constant value by the first and second partitions 16A and 16B and the heat exchanger 23, it is not always necessary to subject the water temperature to the PID control.

The invention can maintain, at a constant value, the temperature of the cooling medium for simultaneously cooling object to be temperature controlled (e.g. heat generators or to-be-tested objects) individually contained in a plurality of containers. Therefore, the objects to be temperature controlled contained in the respective containers can be maintained at a constant temperature.

In the invention, the objects to be temperature controlled can be cooled to a uniform temperature distribution.

The invention employs two partitions, which define a third storage area as a buffer area between first and second storage areas. This third storage area enables more reliably keeping of a cooling medium in the first storage area at a constant temperature.

The invention employs a constant pressure control valve, which permits a predetermined amount of cooling medium to be supplied to each cooling jacket without being influenced by pressure fluctuations on the upstream side. As a result, each cooling jacket can have a stabilized cooling capacity.

The invention employs a constant pressure relief valve, which permits the pressure in each cooling water pipe line to be kept constant, and hence stabilizes the circulated amount of the cooling water.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept at defined by the appended claims and their equivalents.

What is claimed is:

1. A temperature managing apparatus for simultaneously maintaining, at a predetermined temperature, objects to be temperature controlled, comprising:

a plurality of containers each containing the object to be temperature controlled;

a plurality of jackets provided in each of the containers for controlling the temperature of a corresponding one of the objects to be temperature controlled;

a tank for storing a temperature control medium for the jackets, the tank including first and second storage areas partitioned by at least one movable partition;

a first outlet pipe line and a first pump for transferring the temperature control medium from the first storage area to each jacket;

a first return pipe line for transferring the temperature control medium from said each jacket to the second storage area;

a third pipe line and a second pump for transferring the temperature control medium from the second storage area to the first storage area via a heat exchanger for adjusting the temperature control medium to a predetermined temperature;

a thermometer for measuring a temperature of the temperature control medium in the second storage area; and a partition driving mechanism for moving the at least one partition on the basis of the temperature measured by the thermometer.

2. A temperature managing apparatus according to claim 1, wherein the at least one partition includes two partitions, and the tank is partitioned by the two partitions into the first and second storage areas and a third storage area defined between the first and second storage areas.

3. A temperature managing apparatus according to claim 1, wherein the plurality of jackets include an upper jacket located above each object to be temperature controlled, and a lower jacket located below said each object to be temperature controlled.

4. A temperature managing apparatus according to claim 1, further comprising a constant pressure control valve provided across the first outlet pipe line that transfers the temperature control medium from the first storage area to each jacket, the constant pressure control valve making constant an amount of the temperature control medium transferred to said each jacket, thereby stabilizing temperature control performed by said each jacket.

5. A temperature managing apparatus according to claim 1, further comprising a constant pressure relief valve provided across the first outlet pipe line that transfers the temperature control medium from the first storage area to each jacket, the constant pressure relief valve making constant an amount of the temperature control medium transferred to said each jacket, thereby stabilizing temperature control performed by said each jacket.

6. A temperature managing apparatus according to claim 1, further comprising:

a temperature control mechanism for making constant a temperature of the temperature control medium transferred from the first storage area to each jacket, using movement of the partition that partitions the tank into the first and second storage areas, and the heat exchanger; and a constant pressure control valve and a constant pressure relief valve that are provided across the first outlet pipe line that transfers the temperature control medium from the first storage area to said each jacket, wherein the temperature control medium is transferred at a constant temperature and a constant flow rate from the first storage area to said each jacket, such that temperature control by said each jacket is stabilized.

7. A temperature managing apparatus for simultaneously maintaining, at a predetermined temperature, heat generators, comprising:

a plurality of containers each containing the heat generator;

a plurality of cooling jackets provided in each of the containers for controlling the temperature of a corresponding one of the heat generators;

a tank for storing a temperature control medium for the cooling jackets, the tank including first and second storage areas partitioned by at least one movable partition;

a first outlet line and first pump for transferring the temperature control medium from the first storage area to each cooling jacket;

a first return pipe line for transferring the temperature control medium from said each cooling jacket to the second storage area;

a communication pipe line and second pump for transferring the temperature control medium from the second storage area to the first storage area via a heat exchanger for adjusting the temperature control medium to a predetermined temperature;

a thermometer for measuring a temperature of the temperature control medium in the second storage area; and a partition driving mechanism for moving the at least one partition on the basis of the temperature measured by the thermometer.

8. A temperature managing apparatus according to claim 7, wherein the at least one partition includes two titions, and the tank is partitioned by the two partitions into the first and second storage areas and a third storage area defined between the first and second storage areas.

9. A temperature managing apparatus according to claim 7, wherein the plurality of cooling jackets include an upper cooling jacket located above each heat generator, and a lower cooling jacket located below said each heat generator, and further comprising heater means to be subjected to PID control.

10. A temperature managing apparatus according to claim 7, further comprising a constant pressure control valve provided across the first outlet pipe line that transfers the temperature control medium from the first storage area to each cooling jacket, the constant pressure control valve making constant an amount of the temperature control medium transferred to said each cooling jacket, thereby stabilizing temperature control performed by said each cooling jacket.

11. A temperature managing apparatus according to claim 7, further comprising a constant pressure relief valve provided across the first outlet pipe line that transfers the temperature control medium from the first storage area to each cooling jacket, the constant pressure relief valve making constant an amount of the temperature control medium transferred to said each cooling jacket, thereby stabilizing temperature control performed by said each cooling jacket.

12. A temperature managing apparatus according to claim 7, further comprising:

a temperature control mechanism for making constant a temperature of the temperature control medium transferred from the first storage area to each cooling jacket, using movement of the partition that partitions the tank into the first and second storage areas, and the heat exchanger; and a constant pressure control valve and a constant pressure relief valve that are provided across the first outlet pipe line that transfers the temperature control medium from the first storage area to said each cooling jacket, wherein the temperature control medium is transferred at a constant temperature and a constant flow rate from the first storage area to said each cooling jacket, such that temperature control by said each cooling jacket is stabilized.

13. A temperature managing apparatus according to claim 7, wherein:

the heat generators each consist of an integral object obtained by integrally forming a contactor, a semiconductor wafer and a wafer chuck as one body by a vacuum force; and the containers each consist of a test chamber for executing one of a reliability test and an electric characteristic test of a plurality of semiconductor elements formed on the semiconductor wafer included in the integral object.

14. A temperature managing method, for use in the temperature managing apparatus claimed in one of claims 1 and 7, for simultaneously maintaining, at a predetermined temperature, a plurality of objects to be temperature controlled each contained in a corresponding one of containers, comprising the steps of:

moving the partition that partitions the tank into the first and second storage areas, and using the heat exchanger, such that a temperature of the temperature control medium transferred from the first storage area to each jacket is made constant; and transferring the temperature control medium at a constant flow rate, using the constant pressure control valve and the constant pressure relief valve provided across the first outlet pipe line that transfers the temperature control medium from the first storage area to said each jacket.

* * * * *